United States Patent
Liu et al.

(10) Patent No.: US 10,928,476 B2
(45) Date of Patent: Feb. 23, 2021

(54) READOUT-SEGMENTED DIFFUSION-WEIGHTED IMAGING METHOD, APPARATUS, AND STORAGE MEDIUM

(71) Applicant: Siemens Healthcare GmbH, Erlangen (DE)

(72) Inventors: Wei Liu, Shenzhen (CN); Kun Zhou, Shenzhen (CN); Fang Dong, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 345 days.

(21) Appl. No.: 16/007,332

(22) Filed: Jun. 13, 2018

(65) Prior Publication Data
US 2018/0356487 A1   Dec. 13, 2018

(30) Foreign Application Priority Data
Jun. 13, 2017 (CN) .......................... 201710442188.9

(51) Int. Cl.
*G01R 33/565* (2006.01)
*G01R 33/54* (2006.01)
(Continued)

(52) U.S. Cl.
CPC ... *G01R 33/56554* (2013.01); *G01R 33/4616* (2013.01); *G01R 33/4833* (2013.01);
(Continued)

(58) Field of Classification Search
CPC .......... G01R 33/56545; G01R 33/5616; G01R 33/4833; G01R 33/56341; G01R 33/543;
(Continued)

(56) References Cited

U.S. PATENT DOCUMENTS

2004/0140803 A1   7/2004 Deimling
2004/0257078 A1   12/2004 Porter
(Continued)

FOREIGN PATENT DOCUMENTS

| CN | 1499218 A | 5/2004 |
|---|---|---|
| CN | 1683939 A | 10/2005 |

(Continued)

OTHER PUBLICATIONS

Ahn et al. "View Angle Tilting Echo Planar Imaging for Distortion Correction"; Magnetic Resonance in Medicine; pp. 1211-1219; (2011).
(Continued)

*Primary Examiner* — Jermele M Hollington
*Assistant Examiner* — Suresh K Rajaputra
(74) *Attorney, Agent, or Firm* — Schiff Hardin LLP

(57) ABSTRACT

In a magnetic resonance readout-segmented diffusion-weighted imaging method, apparatus, and storage medium, a non-linear phase RF excitation pulse is applied to nuclear spins that exhibit a magnetization intensity vector, and applying, in a slice selection direction, a slice selection gradient pulse of duration corresponding to the non-linear phase RF excitation pulse, so as to flip the magnetization intensity vector into the X-Y plane. Diffusion weighting is performed on the magnetization intensity vector flipped into the X-Y plane. A readout-segmented sampling sequence is executed to read out raw data in a segmented manner from the magnetization intensity vector resulting from diffusion weighting. A view angle tilting gradient pulse is applied in the slice selection direction.

13 Claims, 6 Drawing Sheets

(51) Int. Cl.
*G01R 33/56* (2006.01)
*G01R 33/483* (2006.01)
*G01R 33/563* (2006.01)
*G01R 33/46* (2006.01)
G01R 33/561 (2006.01)

(52) U.S. Cl.
CPC ....... *G01R 33/543* (2013.01); *G01R 33/5602* (2013.01); *G01R 33/56341* (2013.01); *G01R 33/56545* (2013.01); *G01R 33/5616* (2013.01); *G01R 33/5617* (2013.01)

(58) Field of Classification Search
CPC .......... G01R 33/4616; G01R 33/56554; G01R 33/5617; G01R 33/5602; G01R 33/565; G01R 33/54; G01R 33/56; G01R 33/483
See application file for complete search history.

(56) References Cited

U.S. PATENT DOCUMENTS

| | | |
|---|---|---|
| 2005/0237057 A1 | 10/2005 | Porter |
| 2007/0249929 A1 | 10/2007 | Jeong et al. |
| 2010/0237864 A1 | 9/2010 | Stemmer |
| 2010/0237865 A1 | 9/2010 | Stemmer |
| 2010/0277169 A1 | 11/2010 | Feiweier |
| 2012/0286777 A1 | 11/2012 | Frost et al. |
| 2015/0084629 A1 | 3/2015 | Porter |
| 2015/0115960 A1 | 4/2015 | Grodzki |
| 2018/0120403 A1* | 5/2018 | Liu .................... G01R 33/482 |

FOREIGN PATENT DOCUMENTS

| | | |
|---|---|---|
| CN | 101143093 A | 3/2008 |
| CN | 101879063 A | 11/2010 |
| CN | 102525469 A | 7/2012 |
| CN | 102542534 A | 7/2012 |
| CN | 102772210 A | 11/2012 |
| CN | 104569881 A | 4/2015 |

OTHER PUBLICATIONS

Schulte et al.:: "Equi-ripple design of quadratic-phase RF pulses", Journal of Magnetic Resona. Academic Press, vol. 166, No. 1 pp. 111-122, (2004).

Liu, et al., "Distortion Correction in Readout-Segmented EPI using View Angle Tilting Combined with Phase Modulated RF Pulse", Proceedings of the International Society for Magnetic Resonance in Medicine, 25th Annual Meeting and Exhibition, Honolulu, HI, Apr. 22-27, 2017, Paper No. 1525, (2017).

Porter, et al.: "High Resolution Diffusion-Weighted Imaging Using Readout-Segmented Echo-Planar Imaging, Parallel Imaging and a Two-Dimensional Navigator-Based Reacquisition"; Magnetic Resonance in Medicine; vol. 62; pp. 468-475 ; (2009).

Walter et al., "Combination of integrated dynamic shimming and readout-segmented echo planar imaging for diffusion weighted MRI of the head and neck region at 3 Tesla", Magnetic Resonance Imaging, vol. 42, 17 pp. 32-36, (2017).

Butts et al.; "Reduction of Blurring in View Angle Tilting MRI"; Magnetic Resonance inMedicine; pp. 418-424; 2005.

Title: Quantitative assessment of an MR technique for reducing metal artifact: application to spin-echo imaging in a phantom Author:Mark J. Lee, Dennis L. Janzen, Peter L. Munk, Alex MacKay, Qing-San Xiang, Allister McGowen Skeletal Radiol 2001;30 (7):398-401; 2001.

Chinese Action dated Jun. 16, 2020, Application No. 201710442188.9.

Chinese Patent Office—Notification of Grant for Application No. 201710442188.9, dated Dec. 14, 2020.

* cited by examiner

```
applying a non-linear phase RF excitation pulse to a magnetization
 intensity vector, and applying, in a slice selection direction, a slice
selection gradient pulse of duration corresponding to the non-linear  ──── 101
  phase RF excitation pulse, to flip the magnetization intensity vector
                         into the X-Y plane.
```

```
      performing diffusion weighting on the magnetization intensity vector
                      flipped into the X-Y plane.                          ──── 102
```

```
        using a RESOLVE sequence to read out imaging data in a
         segmented manner from the magnetization intensity vector
      resulting from diffusion weighting, wherein a VAT gradient is        ──── 103
                  applied in the slice selection direction
```

Fig. 1

READOUT-SEGMENTED DIFFUSION-WEIGHTED IMAGING METHOD, APPARATUS, AND STORAGE MEDIUM

BACKGROUND OF THE INVENTION

Field of the Invention

The present invention concerns magnetic resonance diffusion imaging, in particular a readout-segmented diffusion-weighted imaging method, apparatus, and non-transitory data storage medium.

Description of the Prior Art

Diffusion-weighted imaging (DWI) is different from conventional magnetic resonance (MR) technology, mainly relying on the motion of water molecules and not the spin proton density, T1 value or T2 value of tissue, and has provided a completely new technology for tissue imaging comparison. Diffusion of water molecules in tissue is a random thermal motion, and the direction and extent of diffusion are affected by the local tissue micro-environment; for example, in the brain stem and regions of lesions such as tumors, the diffusion of water molecules is restricted, so the degree of diffusion is reduced. MR marks molecules by the magnetization of H+, without causing any interference to the process of diffusion thereof. If a diffusion gradient is added to any conventional MR imaging sequence to highlight diffusion effects, diffusion-weighted imaging can be performed, enabling direct detection of diffusion behavior of water molecules in tissue.

A conventional diffusion imaging sequence generally uses a single-shot echo planar (single-shot EPI) sequence to perform image acquisition; such a sequence readily gives rise to phase errors in regions of non-uniform magnetic field (e.g. air-tissue interfaces and bone-muscle interfaces), resulting in geometric distortion of images. At the present time, an echo planar sequence with readout-segmented acquisition (Readout Segmentation of Long Variable Echo-trains, RESOLVE) has already appeared. Compared with a single-shot echo planar sequence, the RESOLVE sequence can reduce magnetic susceptibility artifacts (susceptibility artifacts), to improve imaging quality.

However, in the case of regions having complex geometric patterns and serious magnetic susceptibility artifacts (e.g. the neck), images acquired by the RESOLVE sequence might still be seriously distorted, with the result that imaging quality is less than ideal.

SUMMARY OF THE INVENTION

An object of the present invention is to provide a readout-segmented diffusion-weighted imaging method and apparatus, and a non-transitory data storage medium that improve imaging quality.

A readout-segmented diffusion-weighted imaging method according to the invention includes operating an MR data acquisition scanner so as to apply a non-linear phase radio frequency (RF) excitation pulse to nuclear spins in an examination subject exhibit that exhibit a magnetization intensity vector, and to apply, in a slice selection direction, a slice selection gradient pulse of duration corresponding to the non-linear phase RF excitation pulse, so as to flip the magnetization intensity vector into the X-Y plane. The MR scanner is further operated so as to perform diffusion weighting on the magnetization intensity vector flipped into the X-Y plane. The MR scanner is further operated so as to execute a readout-segmented sampling sequence in order to read out raw data in a segmented manner from the magnetization intensity vector resulting from the diffusion weighting, with a view angle tilting gradient pulse being applied in the slice selection direction. The raw data acquired in this manner are transformed into image data in a computer and the image data are made available from the computer in electronic form as a data file, for display or storage.

In an embodiment, the non-linear phase RF excitation pulse is a square wave or an approximately square wave in the time domain.

In another embodiment, a non-linear phase size of the non-linear phase RF excitation pulse is K, with $K \leq 3.6/(BW^2 * FTW)$, wherein BW is a bandwidth of the non-linear phase RF excitation pulse, and FTW is a fractional transition width of the non-linear phase RF excitation pulse, $FTW = (w_s - w_p)/BW$; $w_s$ is a stopband frequency of the non-linear phase RF excitation pulse, and $w_p$ is a passband frequency of the non-linear phase RF excitation pulse.

In another embodiment, performing diffusion weighting on the magnetization intensity vector flipped into the X-Y plane is done by applying a diffusion weighting gradient pulse to the magnetization intensity vector flipped into the X-Y plane, applying a refocusing pulse in an RF direction, and applying a slice selection gradient pulse and a spoiling gradient pulse in the slice selection direction.

In another embodiment, the execution of a readout-segmented sampling sequence to read out the raw data in a segmented manner from the magnetization intensity vector resulting from diffusion weighting is done by applying an imaging echo readout gradient pulse in a readout direction in order to read out the raw data, applying a navigator echo readout gradient pulse in the readout direction in order to read out navigator data, for the purpose of correcting phase errors between imaging echoes acquired in a segmented manner, and applying an imaging echo phase encoding gradient pulse and a navigator echo phase encoding gradient pulse in a phase encoding direction.

In a further embodiment, the application of a view angle tilting gradient pulse in the slice selection direction is done by applying view angle tilting gradient pulses on two sides of a navigator echo refocusing pulse in the slice selection direction, the view angle tilting gradient pulses having an imaging echo view angle tilting gradient pulse and a navigator echo view angle tilting gradient pulse, and the method further includes applying, in the slice selection direction, a pre-dephasing gradient pulse of the imaging echo view angle tilting gradient pulse, a focusing gradient pulse of the imaging echo view angle tilting gradient pulse and a pre-dephasing gradient pulse of the navigator echo view angle tilting gradient pulse.

The present invention also encompasses a magnetic resonance imaging apparatus having a magnetic resonance data acquisition scanner and a control computer that is configured to operate the scanner in order to implement any or all embodiments of the method according to the invention, as described above. The control computer can include an image reconstruction processor that reconstructs image data from the acquired raw diffusion data, or an image reconstruction processor may be separate from the control computer. The control computer or the image reconstruction processor may be in communication with a display screen at which the image data can be displayed.

The present invention also encompasses a non-transitory, computer-readable data storage medium encoded with programming instructions that, when the storage medium is loaded into a computer or a computer system of a magnetic resonance imaging apparatus, cause the computer or computer system to operate the magnetic resonance imaging apparatus in order to implement any or all embodiments of the method according to the invention, as described above.

In the technical solution described above, in the present invention, a non-linear phase RF excitation pulse is applied to a magnetization intensity vector, and a slice selection gradient pulse of duration corresponding to the non-linear phase RF excitation pulse is applied in a slice selection direction, so as to flip the magnetization intensity vector into the X-Y plane. Diffusion weighting is performed on the magnetization intensity vector flipped into the X-Y plane, and a readout-segmented sampling sequence is used to read out imaging data in a segmented manner from the magnetization intensity vector resulting from diffusion weighting. A view angle tilting gradient pulse is applied in the slice selection direction. By applying a view angle tilting gradient pulse to the readout-segmented sampling sequence, the present invention compensates for phase errors arising from field non-uniformity, and ameliorates image distortion. Furthermore, the non-linear phase RF excitation pulse overcomes image blurring caused by the view angle tilting gradient pulses. Thus, the present invention can improve imaging quality.

BRIEF DESCRIPTION OF THE DRAWINGS

FIG. 1 is a flowchart of a readout-segmented DWI method according to an embodiment of the present invention.

DESCRIPTION OF THE PREFERRED EMBODIMENTS

Figure 2:
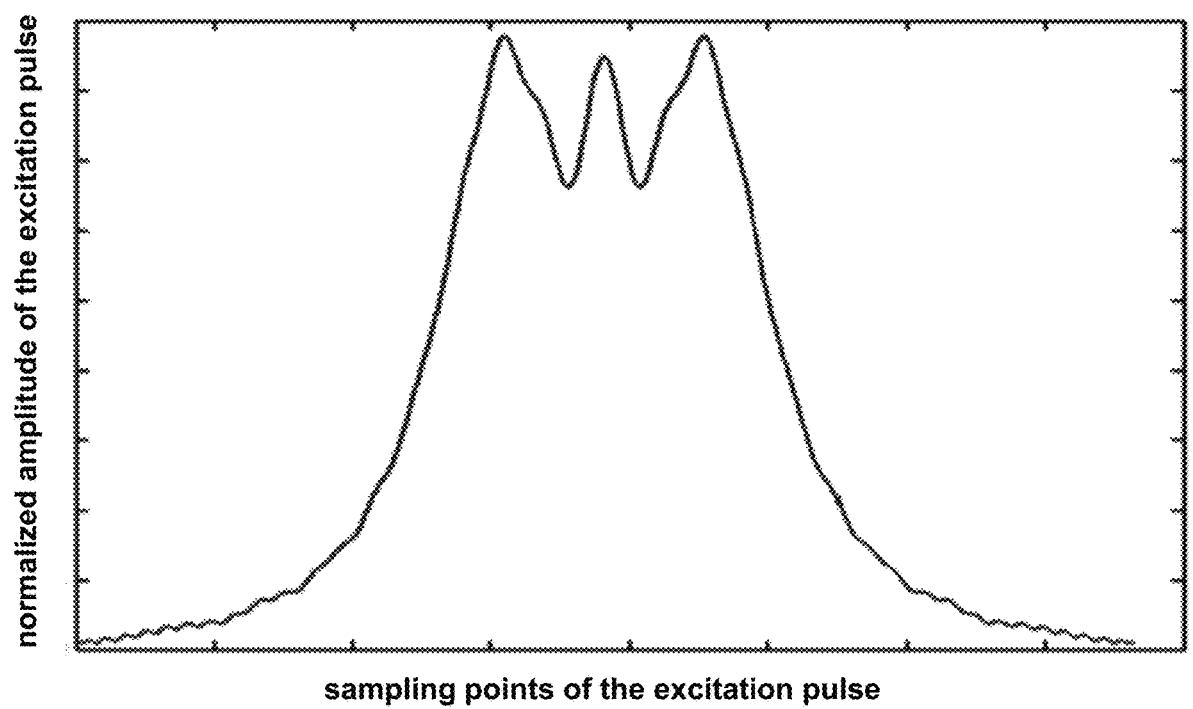
FIG. 2 is an exemplary amplitude diagram of a non-linear phase excitation pulse according to an embodiment of the present invention.

The present invention is explained in further detail below in conjunction with the accompanying drawings and embodiments, to clarify the technical solution and advantages thereof. It should be understood that the particular embodiments described here are merely intended to explain the present invention elaboratively, not to define the scope of protection thereof.

The solution of the present invention is explained below by describing a number of representative embodiments, in order to make the description concise and intuitive. The large number of details in the embodiments are merely intended to assist with understanding of the solution of the present invention. However, the technical solution of the present invention need not be limited to these details when implemented.

The invention is based on the insight gained through experimentation and research that the image distortion problem of the existing RESOLVE sequence is mainly caused by phase errors arising from field non-uniformity. The experimentation and research have also revealed that by applying the view angle tilting (VAT) technique in the RESOLVE sequence to compensate for phase errors caused by field non-uniformity, image distortion can be reduced.

Furthermore, those skilled in the art will realize that an existing diffusion-weighted imaging sequence generally uses a linear phase RF excitation pulse to flip a magnetization intensity vector. The applicants have discovered that when a linear phase RF excitation pulse is used, the combination of the VAT technique with the RESOLVE sequence might lead to undesired image blurring. The applicants have also discovered through much experimentation that by replacing a linear phase RF excitation pulse with a non-linear phase RF excitation pulse, image blurring caused by the VAT technique can be significantly reduced or even overcome.

Based on the above analysis, FIG. 1 is a flowchart of a readout-segmented DWI method according to an embodiment of the present invention. All of the steps are performed by operation of an MR data acquisition scanner, including the image reconstruction processor thereof, As FIG. 1 shows, the method includes:

Step 101: applying a non-linear phase RF excitation pulse to a magnetization intensity vector, and applying, in a slice selection direction, a slice selection gradient pulse of duration corresponding to the non-linear phase RF excitation pulse, to flip the magnetization intensity vector into the X-Y plane.

In MR DWI, the direction of the main magnetic field $B_0$ is generally defined as the Z direction of a 3D Cartesian coordinate system; the other two directions which are orthogonal to the main magnetic field $B_0$ are defined as the X direction and the Y direction respectively. The X direction and Y direction together form the X-Y plane.

In an embodiment of the present invention, a linear phase RF excitation pulse is replaced with the non-linear phase RF excitation pulse.

The non-linear phase RF excitation pulse is an RF pulse having non-linear phase. A conventional linear phase RF pulse may be regarded as flipping magnetization vectors within a frequency selection range into the X-Y plane at the same moment in time, therefore the energy thereof is concentrated in a main peak of short duration, so that the pulse amplitude distribution is not uniform. By altering the phase of an RF pulse, magnetization vectors within a frequency selection range can be sequentially flipped into the X-Y plane within the pulse duration, therefore the energy thereof need not be concentrated in a main peak of short duration; such a phase-altered RF pulse is an RF pulse having non-linear phase. Using a non-linear phase pulse design method, an excitation pulse with a more even amplitude distribution can be obtained while ensuring a pulse slice selection profile.

Preferably, the non-linear phase RF excitation pulse in an embodiment of the present invention has a square-wave or approximately square-wave shape in the time domain. The non-linear phase RF excitation pulse having a square-wave or approximately square-wave shape in the time domain has a uniform amplitude distribution, can reduce a k-space filtering effect, and reduces image blurring.

A non-linear phase size K is an important parameter of the non-linear phase RF excitation pulse. When K is increased, the distribution of the amplitude of the RF pulse within the duration thereof is more even, but a slice selection profile of the pulse will be affected.

In an embodiment of the present invention, K preferably satisfies the following relation: K≤3.6/(BW$^2$*FTW), wherein BW is a bandwidth of the RF pulse, and FTW is a partial excess bandwidth, FTW=(w$_s$−w$_p$)/BW, wherein W$_s$ and W$_P$ are a stopband frequency and a passband frequency of the non-linear phase RF excitation pulse respectively.

An increase in K will result in an increase in RF pulse length, therefore in actual applications, an RF pulse less than a certain amplitude is suitably cut off so as to obtain a suitable RF pulse length. However, excessive cut-off will also affect the slice selection profile of the pulse.

In an embodiment of the present invention, an RF pulse portion with an amplitude less than 5% of a maximum amplitude is preferably cut off, i.e. an RF pulse amplitude with an amplitude value less than 5% of a maximum amplitude value is set to zero, thereby reducing the pulse duration.

Specifically, the non-linear phase RF excitation pulse can be designed in various ways in embodiments of the present invention.

For example, the Shinnar-Le Roux (SLR) method may be used to design the non-linear phase RF excitation pulse in an embodiment of the present invention. In the SLR method, the RF pulse may be regarded as a combination of two complex polynomials A and B; by re-designing the complex polynomial B, the shape of the RF pulse and the slice selection profile thereof can be changed. Once the complex polynomial B has been determined, the complex polynomial A can be calculated by minimizing pulse energy. The complex polynomial B is usually designed as a linear phase, maximum phase and minimum phase, in which case the pulse amplitude distribution is not uniform; when applied to the view angle tilting technique, this will give rise to a serious filtering effect. By changing the phase of the complex polynomial B, the amplitude distribution of the pulse can be changed while ensuring the pulse slice selection profile. In an embodiment of the present invention, it is desired to obtain an excitation pulse with a more uniform amplitude distribution; the SLR method may be used to design and obtain a complex polynomial B, then optimization may be performed by applying a different non-linear phase thereto, to obtain an excitation pulse with an even amplitude distribution.

Figure 3:
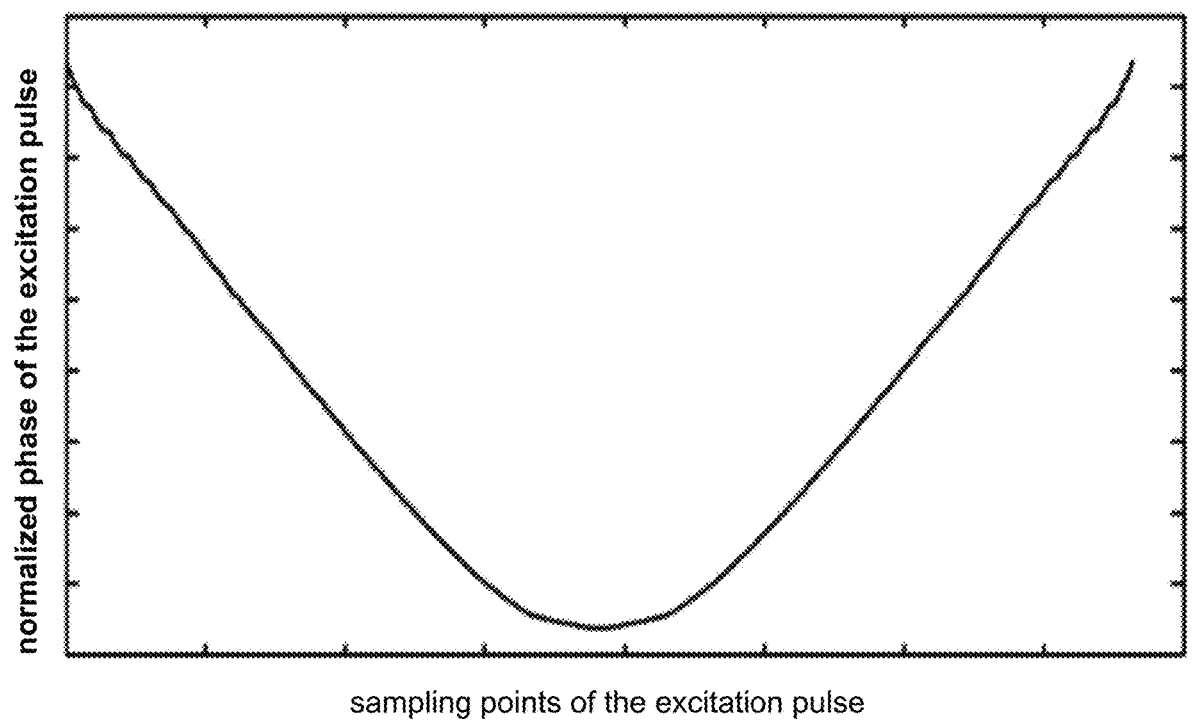
FIG. 3 is an exemplary phase diagram of a non-linear phase excitation pulse according to an embodiment of the present invention.

FIG. 2 is a demonstrative amplitude diagram of a non-linear phase excitation pulse according to an embodiment of the present invention; FIG. 3 is a demonstrative phase diagram of a non-linear phase excitation pulse according to an embodiment of the present invention. In FIG. 2, the horizontal axis is sampling points of the excitation pulse, and the vertical axis is normalized amplitude of the excitation pulse; in FIG. 3, the horizontal axis is sampling points of the excitation pulse, and the vertical axis is normalized phase of the excitation pulse.

As can be seen from FIGS. 2 and 3, compared with a linear phase excitation pulse having a single main peak, the non-linear phase excitation pulse has multiple main peaks, therefore the main peak width is longer, and the amplitude distribution is even.

The non-linear phase RF excitation pulse used in an embodiment of the present invention has been described demonstratively above. Those skilled in the art will realize that such a description is merely demonstrative, and not intended to limit the scope of protection of embodiments of the present invention.

Step 102: performing diffusion weighting on the magnetization intensity vector flipped into the X-Y plane.

Here, diffusion weighting may be performed by applying a diffusion weighting gradient pulse to the magnetization intensity vector flipped into the X-Y plane, applying a refocusing pulse in an RF direction, and applying a slice selection gradient pulse and a spoiling gradient pulse in the slice selection direction.

Step 103: using a RESOLVE sequence to read out imaging data in a segmented manner from the magnetization intensity vector resulting from diffusion weighting, wherein a VAT gradient is applied in the slice selection direction.

The VAT technique was originally used to solve the problems of chemical shift in the readout direction and image distortion caused by field non-uniformity in conventional spin echo sequences. The VAT technique has also been applied to an echo planar sequence: i.e. while applying a phase encoding gradient, a gradient is additionally applied in the slice selection direction. Under the simultaneous action of these two gradients, an MR signal that is read out at this time will form a view angle tilt in the phase encoding and slice selection directions, thereby reducing image distortion in the reconstructed signal caused by field non-uniformity. Since the RESOLVE sequence has a much smaller echo spacing than single-shot echo planar imaging, it is more suited to the introduction of the VAT technique to further ameliorate image distortion caused by field non-uniformity.

When the phase encoding gradient is applied in the phase encoding direction, the VAT gradient is simultaneously applied in the slice selection direction, and an MR signal S may be expressed using the following formula:

$$s(t_m,t_n)=\int_x\int_y\int_{\Delta Sl+\Delta z(x,y)}\rho(x,y,z)\exp(-j\gamma nG_{vat}t_bz)\times\exp(-j\gamma\Delta B(x,y)nT_{esp})\times\exp[-j\gamma(mG_x\Delta t_x x+nG_y t_b y)]dxdydz;$$

wherein: $\Delta B(x, y)$ is B0 offset at the position $(x, y)$; $G_{vat}$ is the gradient applied in the slice selection direction at the same time as the phase encoding gradient is applied; $\rho(x, y, z)$ is spin density; $\gamma$ is the gyromagnetic ratio; $\Delta t_x$ is sampling rate in the readout direction; $T_{esp}$ is echo spacing; $t_b$ is phase encoding gradient time; $\Delta z(x,y)$ is shift in the slice selection direction caused by field non-uniformity, $\Delta z(x, y)=-\Delta B(x, y)/G_z$, wherein Gz is the slice selection gradient; $\Delta Sl$ is slice thickness; and m, n are k-space coordinates in the readout direction and the frequency encoding direction respectively.

In one embodiment, the application of a VAT gradient pulse in the slice selection direction includes applying VAT gradient pulses on two sides of a navigator echo refocusing pulse in the slice selection direction, the VAT gradient pulses comprising an imaging echo VAT gradient pulse and a navigator echo VAT gradient pulse; and the method further comprises: applying, in the slice selection direction, a pre-dephasing gradient pulse of the imaging echo VAT gradient pulse, a focusing gradient pulse of the imaging echo VAT gradient pulse and a pre-dephasing gradient pulse of the navigator echo VAT gradient pulse.

In one embodiment, the step of using the RESOLVE sequence to read out imaging data in a segmented manner from the magnetization intensity vector resulting from diffusion weighting includes applying an imaging echo readout gradient pulse in the readout direction to read out imaging data, applying a navigator echo readout gradient pulse in the readout direction to read out navigator data, for the purpose of correcting phase errors between imaging echoes acquired in a segmented manner, and applying an imaging echo phase encoding gradient pulse and a navigator echo phase encoding gradient pulse in the phase encoding direction.

A process of implementing the use of the RESOLVE sequence in an embodiment of the present invention is described demonstratively below.

Figure 4:
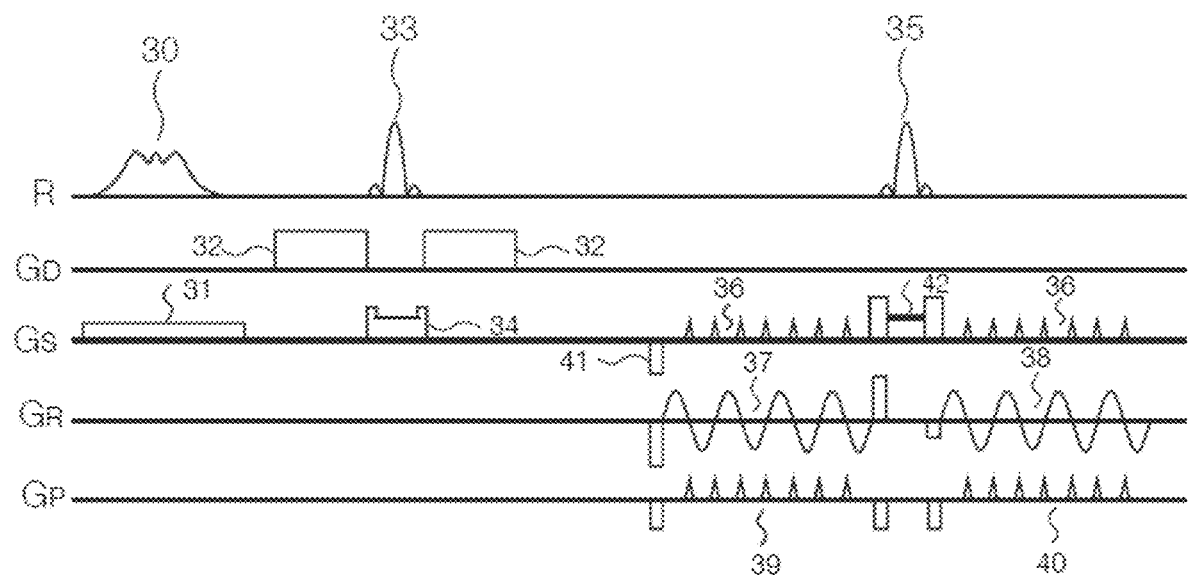
FIG. 4 is a diagram of the RESOLVE sequence using VAT and a non-linear phase excitation pulse according to an embodiment of the present invention.

FIG. 4 is a diagram of the RESOLVE sequence using VAT and a non-linear phase excitation pulse according to an embodiment of the present invention.

FIG. 4 shows, from top to bottom, RF (R) pulses, diffusion gradients ($G_D$), slice selection gradients ($G_S$), readout direction ($G_R$) and phase encoding ($G_P$) direction.

First, a 90-degree non-linear phase RF excitation pulse 30 is applied, and a slice selection gradient pulse 31 of duration corresponding to the non-linear phase RF excitation pulse 30 is applied in the slice selection direction, to flip the magnetization intensity vector into the X-Y plane.

Next, diffusion weighting is performed on the magnetization intensity vector flipped into the X-Y plane. This specifically includes applying an imaging echo refocusing pulse 33 (e.g. a 180-degree RF pulse), and applying diffusion weighting gradient pulses 32 on two sides of the imaging echo refocusing pulse 33 in a diffusion gradient direction, and also applying a slice selection gradient pulse and a spoiling gradient pulse 34 of duration corresponding to the imaging echo refocusing pulse 33 in the slice selection direction, wherein the spoiling gradient pulse is used to dissipate a free induction decay (FID) factor arising from the 180-degree RF pulse 33, so as to perform diffusion weighting on the magnetization intensity vector flipped into the X-Y plane.

Next, a navigator echo refocusing pulse 35 (e.g. a 180-degree RF pulse) is applied, and an imaging echo readout gradient pulse 37 and a navigator echo readout gradient pulse 38 are separately applied on two sides of the navigator echo refocusing pulse 35 in the readout direction, wherein the imaging echo readout gradient pulse 37 is used to read out imaging data in a segmented manner; and the navigator echo readout gradient pulse 38 is used to read out navigator data, for the purpose of correcting phase errors between imaging echoes acquired in a segmented manner. In the phase encoding direction, an imaging echo phase encoding gradient pulse 39 and a navigator echo phase encoding gradient pulse 40 are separately applied on two sides of the navigator echo refocusing pulse 35. In the slice selection direction, the following gradient pulses are applied:

(1), VAT gradient pulses 36 on two sides of the navigator echo refocusing pulse 35. The VAT gradient pulses 36 comprise: an imaging echo VAT gradient pulse (on the left side of the navigator echo refocusing pulse 35) and a navigator echo VAT gradient pulse (on the right side of the navigator echo refocusing pulse 35).

(2), a pre-dephasing gradient pulse 41 of the imaging echo VAT gradient pulse.

(3), a gradient combination 42 of duration corresponding to the navigator echo refocusing pulse 35. The gradient combination 42 comprises: a slice selection gradient and a spoiling gradient corresponding to the navigator echo refocusing pulse 35, a focusing gradient of the imaging echo VAT gradient pulse and a pre-dephasing gradient of the navigator echo VAT gradient pulse.

The VAT gradient pulses 36 compensate for phase errors caused by field non-uniformity, and ameliorate image distortion. Furthermore, the non-linear phase RF excitation pulse 30 has a uniform amplitude distribution, and is approximately rectangular in the time domain, so can improve image blurring which might be caused by the VAT gradient pulses 36.

Figure 5A:
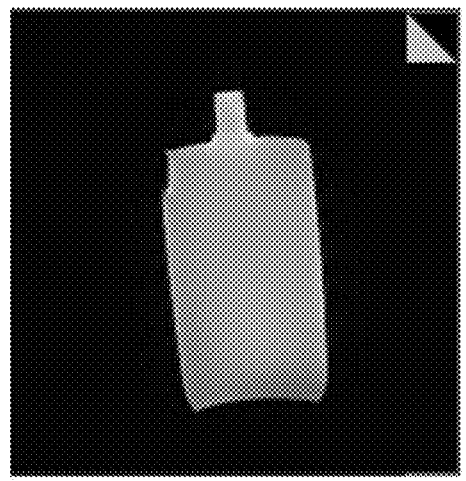
FIG. 5A is an example of an image obtained according to a turbo spin echo (TSE) sequence.
Figure 5B:
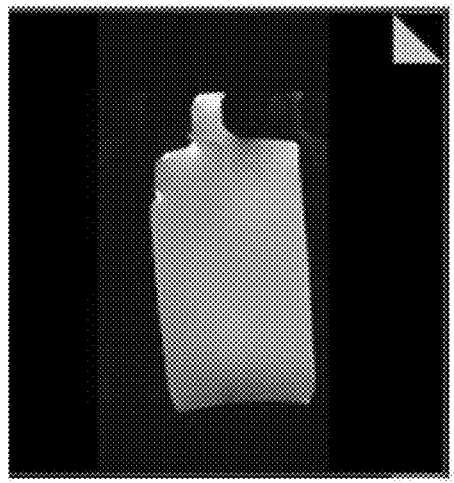
FIG. 5B is an example of an image obtained according to the RESOLVE sequence in the prior art.
Figure 5C:
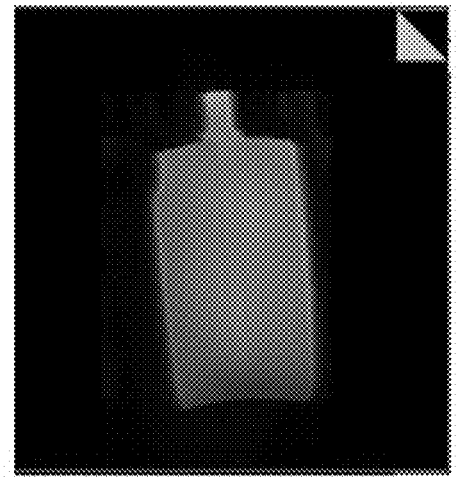
FIG. 5C is an example of an image obtained according to the RESOLVE sequence in an embodiment of the present invention.

FIG. 5A is an example of an image obtained according to a turbo spin echo (TSE) sequence; FIG. 5B is an example of an image obtained according to the RESOLVE sequence in the prior art; FIG. 5C is an example of an image obtained according to the RESOLVE sequence in an embodiment of the present invention.

It can be seen from FIGS. 5A-5C that the imaging quality of FIG. 5B is superior to the imaging quality of FIG. 5A, and the imaging quality of FIG. 5C is obviously superior to the imaging quality of FIG. 5B.

Figure 6:
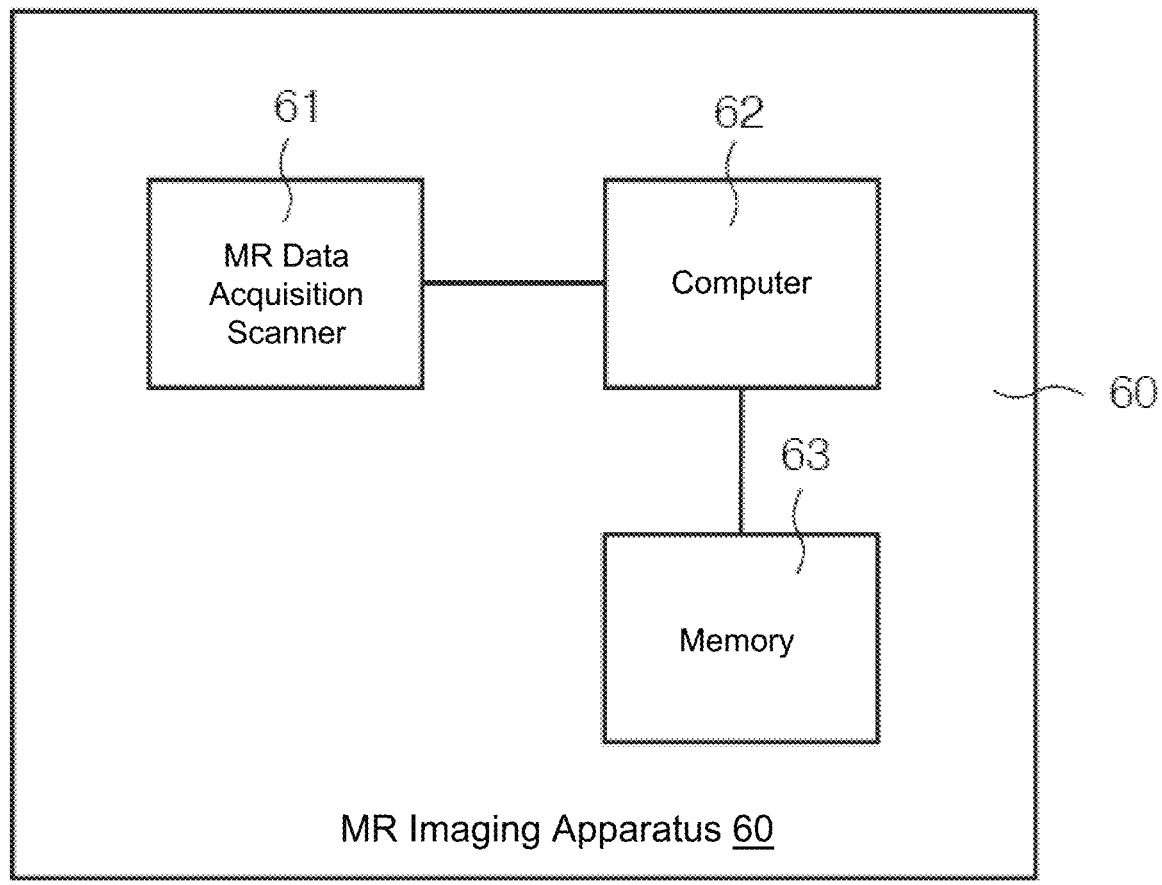
FIG. 6 is a block diagram of a readout-segmented DWI apparatus according to an embodiment of the present invention.

FIG. 6 is a block diagram of a readout-segmented DWI apparatus according to an embodiment of the present invention.

FIG. 6 is a block diagram showing the basic components of a magnetic resonance imaging apparatus 60 that is designed to implement any or all embodiments of the method according to the invention, as described above. The magnetic resonance imaging apparatus 60 has a magnetic resonance data acquisition scanner 61 that is operated by a computer 62, which has access to program code stored in a memory 63. The stored program code cause the computer 62 to operate the scanner 61 so as to implement any or all embodiments of the method according to the invention, as described above.

The scanner 61 includes all of the basic components that are commonly present in a magnetic resonance data acquisition scanner, such as a basic field magnet, an RF transmitter/receiver antenna arrangement, and a gradient coil arrangement. The RF antenna arrangement radiates the aforementioned RF pulses, and the gradient coil arrangement activates the aforementioned gradients. The control computer 62 controls the coordinated radiation and activation of those components so as to implement the method according to the invention.

The computer 62 can include an image reconstruction processor in order to reconstruct image data from the raw data acquired in the manner described above. The computer 62 can also include a display monitor with a display screen at which the image data can be viewed. The program code stored in the memory 63 are loaded into the memory 63 by a non-transitory, computer-readable data storage medium. The storage medium can be, for example, a floppy disk, an optical disk, a DVD, a hard disk, a flash memory, etc. Furthermore, the readout-segmented DWI method in accordance with the invention can be implemented in a storage medium such as a flash memory (Nand flash), such as USB stick, CF card, SD card, SDHC card, MMC card, SM card, memory stick, xD card, etc.

In summary, in the present invention, a non-linear phase RF excitation pulse is applied to a magnetization intensity vector, and a slice selection gradient pulse of duration corresponding to the non-linear phase RF excitation pulse is applied in a slice selection direction, to flip the magnetization intensity vector into the X-Y plane. Diffusion weighting is performed on the magnetization intensity vector flipped into the X-Y plane. A RESOLVE sequence is used to read out imaging data in a segmented manner from the magnetization intensity vector resulting from diffusion weighting, with a VAT gradient pulse being applied in the slice selection direction. By applying VAT gradient pulses to the RESOLVE sequence. The present invention compensates for phase errors arising from field non-uniformity, and ameliorates image distortion. The non-linear phase RF excitation pulse overcomes image blurring caused by the VAT gradient pulses, thereby improving imaging quality.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) readout-segmented, diffusion-weighted imaging method, comprising:
    operating an MR data acquisition scanner to apply a non-linear phase radio-frequency (RF) excitation pulse to nuclear spins in an examination subject, said nuclear spins exhibiting a magnetization intensity vector;
    operating the MR data acquisition scanner to apply a slice selection gradient pulse in a slice selection direction, said slice selection gradient pulse being applied for a duration corresponding to the non-linear phase RF excitation pulse, with a combination of the non-linear phase radio-frequency excitation pulse and said slice selection gradient flipping the magnetization intensity vector into an X-Y plane of a Cartesian coordinate system;
    operating the MR data acquisition scanner in order to perform diffusion weighting on the magnetization intensity vector flipped into the X-Y plane;
    operating the MR data acquisition scanner to execute a readout-segmented sampling sequence in order to readout raw data in a segmented manner from the magnetization intensity vector resulting from said diffusion weighting, while applying a view angle tilting gradient in the slice selection direction; and
    providing said raw data to a computer and, in said computer, reconstructing image data from the raw data and making the reconstructed image data available from the computer in electronic form, as a data file.

2. The readout-segmented diffusion-weighted imaging method as claimed in claim 1, comprising applying the non-linear phase RF excitation pulse as a square wave or an approximately square wave in the time domain.

3. The readout-segmented diffusion-weighted imaging method as claimed in claim 1, comprising applying the non-linear phase RF excitation pulse with the non-linear phase being K, wherein $K \leq 3.6/(BW^2 * FTW)$, wherein BW is a bandwidth of the non-linear phase RF excitation pulse, and FTW is a fractional transition width of the non-linear phase RF excitation pulse, $FTW = (w_s - w_p)/BW$; $w_s$ is a stopband frequency of the non-linear phase RF excitation pulse, and $w_p$ is a passband frequency of the non-linear phase RF excitation pulse.

4. The readout-segmented diffusion-weighted imaging method as claimed in claim 1, comprising executing the diffusion weighting on the magnetization intensity vector flipped into the X-Y plane by:
    applying a diffusion weighting gradient pulse to the magnetization intensity vector flipped into the X-Y plane;
    applying a refocusing pulse in an RF direction; and
    applying a slice selection gradient pulse and a spoiling gradient pulse in the slice selection direction.

5. The readout-segmented diffusion-weighted imaging method as claimed in claim 1, comprising executing the readout-segmented sampling sequence to read out imaging data in a segmented manner from the magnetization intensity vector resulting from diffusion weighting by:
    applying an imaging echo readout gradient pulse in a readout direction to read out imaging data;
    applying a navigator echo readout gradient pulse in the readout direction to read out navigator data and thereby correcting phase errors between imaging echoes acquired in a segmented manner; and
    applying an imaging echo phase encoding gradient pulse and a navigator echo phase encoding gradient pulse in a phase encoding direction.

6. The readout-segmented diffusion-weighted imaging method as claimed in claim 1, wherein applying a view angle tilting gradient pulse in the slice selection direction comprises applying view angle tilting gradient pulses on two sides of a navigator echo refocusing pulse in the slice selection direction, and applying the view angle tilting gradient pulses so as to comprise an imaging echo view angle tilting gradient pulse and a navigator echo view angle tilting gradient pulse, and wherein the method further comprises:
    applying, in the slice selection direction, a pre-dephasing gradient pulse of the imaging echo view angle tilting gradient pulse; and
    applying a focusing gradient pulse of the imaging echo view angle tilting gradient pulse and a pre-dephasing gradient pulse of the navigator echo view angle tilting gradient pulse.

7. A magnetic resonance (MR) readout-segmented, diffusion-weighted imaging apparatus, comprising:
    an MR data acquisition scanner;
    a computer configured to operate said MR data acquisition scanner to apply a non-linear phase radio-frequency (RF) excitation pulse to nuclear spins in an examination subject, said nuclear spins exhibiting a magnetization intensity vector;
    said computer being configured to operate the MR data acquisition scanner to apply a slice selection gradient pulse in a slice selection direction, said slice selection gradient pulse being applied for a duration corresponding to the non-linear phase RF excitation pulse, with a combination of the non-linear phase radio-frequency excitation pulse and said slice selection gradient flipping the magnetization intensity vector into an X-Y plane of a Cartesian coordinate system;
    said computer being configured to operate the MR data acquisition scanner in order to perform diffusion weighting on the magnetization intensity vector flipped into the X-Y plane;
    said computer being configured to operate the MR data acquisition scanner to execute a readout-segmented sampling sequence in order to readout raw data in a segmented manner from the magnetization intensity vector resulting from said diffusion weighting, while applying a view angle tilting gradient in the slice selection direction; and
    said computer being configured to reconstruct image data from the raw data and to make the reconstructed image data available from the computer in electronic form, as a data file.

8. The readout-segmented diffusion-weighted imaging apparatus as claimed in claim 7, wherein said computer is configured to operate said MR data acquisition scanner to apply the non-linear phase RF excitation pulse as a square wave or an approximately square wave in the time domain.

9. The readout-segmented diffusion-weighted imaging apparatus as claimed in claim 7, wherein said computer is configured to operate said MR data acquisition scanner to apply the non-linear phase RF excitation pulse with the non-linear phase being K, wherein $K \leq 3.6/(BW^2 * FTW)$, wherein BW is a bandwidth of the non-linear phase RF excitation pulse, and FTW is a fractional transition width of the non-linear phase RF excitation pulse, $FTW=(w_s-w_p)/BW$; $w_s$ is a stopband frequency of the non-linear phase RF excitation pulse, and $w_p$ is a passband frequency of the non-linear phase RF excitation pulse.

10. The readout-segmented diffusion-weighted imaging apparatus as claimed in claim 7, wherein said computer is configured to operate said MR data acquisition scanner to execute the diffusion weighting on the magnetization intensity vector flipped into the X-Y plane by:
applying a diffusion weighting gradient pulse to the magnetization intensity vector flipped into the X-Y plane;
applying a refocusing pulse in an RF direction; and
applying a slice selection gradient pulse and a spoiling gradient pulse in the slice selection direction.

11. The readout-segmented diffusion-weighted imaging apparatus as claimed in claim 7, wherein said computer is configured to operate said MR data acquisition scanner to execute a readout-segmented sampling sequence to read out imaging data in a segmented manner from the magnetization intensity vector resulting from diffusion weighting by:
applying an imaging echo readout gradient pulse in a readout direction to read out imaging data;
applying a navigator echo readout gradient pulse in the readout direction to read out navigator data and thereby correcting phase errors between imaging echoes acquired in a segmented manner; and
applying an imaging echo phase encoding gradient pulse and a navigator echo phase encoding gradient pulse in a phase encoding direction.

12. The readout-segmented diffusion-weighted imaging apparatus as claimed in claim 7 wherein:
said computer is configured to operate said MR data acquisition scanner to apply a view angle tilting gradient pulse in the slice selection direction by applying view angle tilting gradient pulses on two sides of a navigator echo refocusing pulse in the slice selection direction, and applying the view angle tilting gradient pulses so as to comprise an imaging echo view angle tilting gradient pulse and a navigator echo view angle tilting gradient pulse;
said computer is configured to operate said MR data acquisition scanner to apply, in the slice selection direction, a pre-dephasing gradient pulse of the imaging echo view angle tilting gradient pulse; and
said computer is configured to operate said MR data acquisition scanner to apply a focusing gradient pulse of the imaging echo view angle tilting gradient pulse and a pre-dephasing gradient pulse of the navigator echo view angle tilting gradient pulse.

13. A non-transitory, computer-readable data storage medium encoded with programming instructions, said storage medium being loaded into a computer system of a magnetic resonance (MR) apparatus having an MR data acquisition scanner, and said programming instructions causing said computer system to operate said MR apparatus to:
operate said MR data acquisition scanner to apply a non-linear phase radio-frequency (RF) excitation pulse to nuclear spins in an examination subject, said nuclear spins exhibiting a magnetization intensity vector;
operate the MR data acquisition scanner to apply a slice selection gradient pulse in a slice selection direction, said slice selection gradient pulse being applied for a duration corresponding to the non-linear phase RF excitation pulse, with a combination of the non-linear phase radio-frequency excitation pulse and said slice selection gradient flipping the magnetization intensity vector into an X-Y plane of a Cartesian coordinate system;
operate the MR data acquisition scanner in order to perform diffusion weighting on the magnetization intensity vector flipped into the X-Y plane;
operate the MR data acquisition scanner to execute a readout-segmented sampling sequence in order to read-out raw data in a segmented manner from the magnetization intensity vector resulting from said diffusion weighting, while applying a view angle tilting gradient in the slice selection direction; and
reconstruct image data from the raw data and make the reconstructed image data available from the computer in electronic form, as a data file.

\* \* \* \* \*